(12) United States Patent
Endo et al.

(10) Patent No.: US 7,198,888 B2
(45) Date of Patent: Apr. 3, 2007

(54) WATER-SOLUBLE MATERIAL, CHEMICALLY AMPLIFIED RESIST AND PATTERN FORMATION METHOD USING THE SAME

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/013,333

(22) Filed: Dec. 17, 2004

(65) Prior Publication Data

US 2005/0191576 A1    Sep. 1, 2005

(30) Foreign Application Priority Data

Dec. 22, 2003    (JP)    ............................. 2003-425071

(51) Int. Cl.
G03F 7/20 (2006.01)
G03F 7/30 (2006.01)
G03F 7/09 (2006.01)
G03C 1/76 (2006.01)

(52) U.S. Cl. .................... 430/325; 430/326; 430/213.1
(58) Field of Classification Search ..................... None
See application file for complete search history.

(56) References Cited

U.S. PATENT DOCUMENTS

| 4,968,584 | A | * | 11/1990 | Nagashima et al. | ........ | 430/309 |
| 5,824,451 | A | * | 10/1998 | Aoai et al. | ............... | 430/270.1 |
| 2003/0152845 | A1 | | 8/2003 | Kumada et al. | | |
| 2004/0134365 | A1 | * | 7/2004 | Mori | ........................ | 101/459 |

FOREIGN PATENT DOCUMENTS

| EP | 0 691 575 | 1/1996 |
| EP | 0 709 736 | 5/1996 |
| EP | 0 716 344 | 6/1996 |
| JP | 5-165219 | 7/1993 |
| JP | 2000-138156 | 5/2000 |
| JP | 2001-138156 A | 5/2000 |

(Continued)

OTHER PUBLICATIONS

Namatsu, Hideo., et al. "Supercritical resist dryer." J. Vac. Sci. Technol. B 18(2) Mar./Apr. 2000, pp. 780-784.

(Continued)

*Primary Examiner*—Sin Lee
(74) *Attorney, Agent, or Firm*—McDermott Will & Emery LLP

(57) ABSTRACT

A water-soluble material used for forming a water-soluble film on a chemically amplified resist film includes a water-soluble polymer, an acid generator and a compound constructing an inclusion compound for incorporating the acid generator. Also, in a pattern formation method, a chemically amplified resist film is formed on a substrate, and a water-soluble film made of a water-soluble material including a water-soluble polymer, an acid generator and a compound constructing an inclusion compound for incorporating the acid generator is formed on the resist film. Thereafter, pattern exposure is carried out by selectively irradiating the resist film with exposing light through the water-soluble film, the resultant resist film is developed and the water-soluble film is removed. Thus, a resist pattern made of the resist film is formed.

12 Claims, 7 Drawing Sheets

FOREIGN PATENT DOCUMENTS

JP        3343219        8/2002

OTHER PUBLICATIONS

Tanaka, Keiichi., et al. "Improvement of pattern collapse issue by additive added D.I water rinse process." Proc. SPIE. vol. 5039, p. 1366-1381(2003).

Kishkovich, Oleg P., et al. "Amino Control for DUV Lithography: Identifying Hidden Sources." Proc of SPIE vol. 3999, 6999 (2000) pp. 699-705.

J. Kim et al., "Novel Molecular resists Based on Inclusion Complex of Cyclodextrin", XP 002383992 Search Report dated Jun. 7, 2006.

* cited by examiner

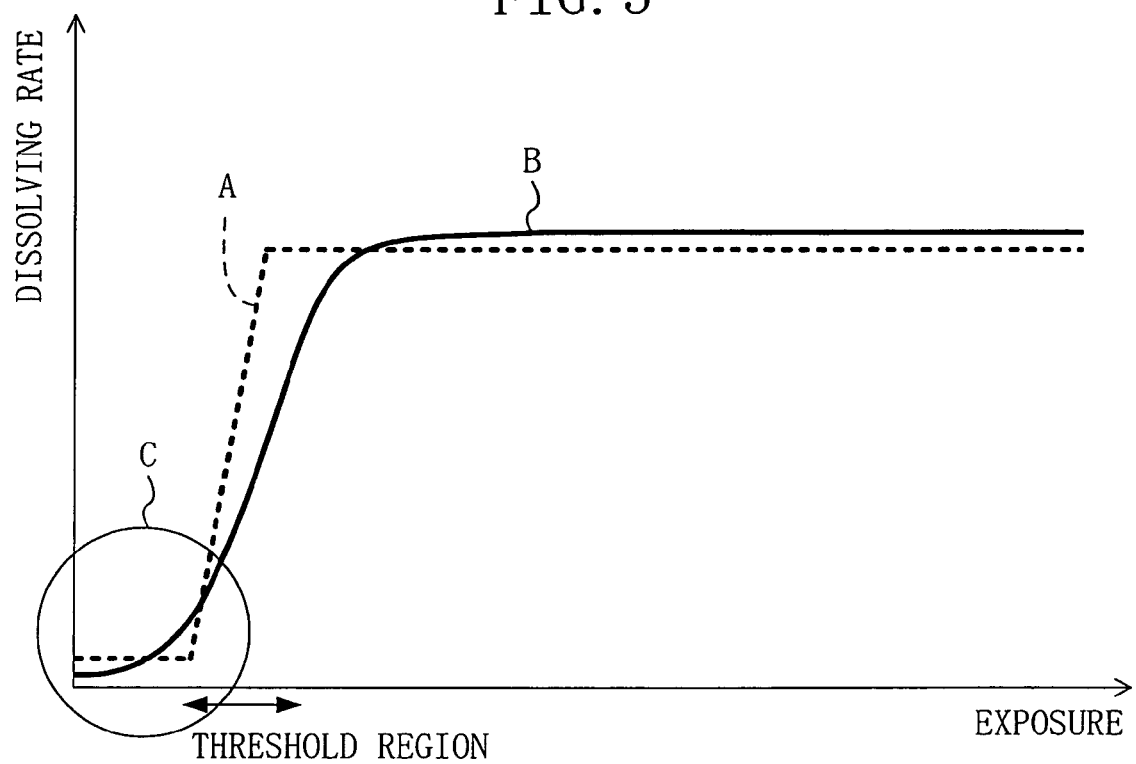

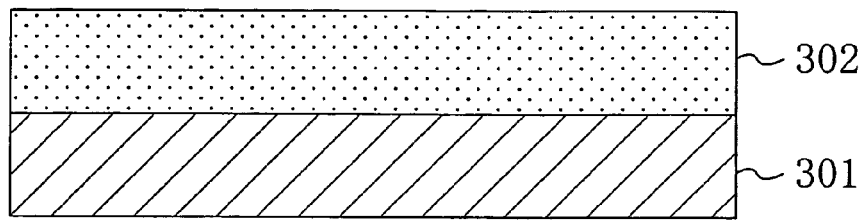
FIG. 6A
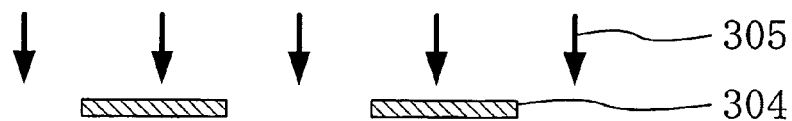
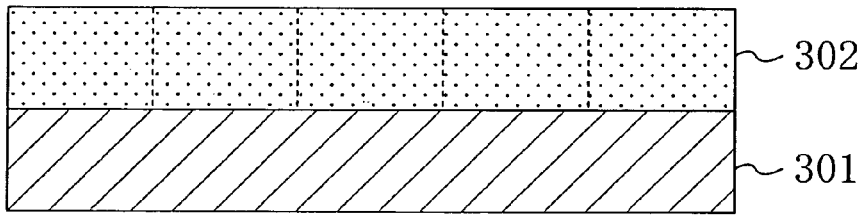
FIG. 6B
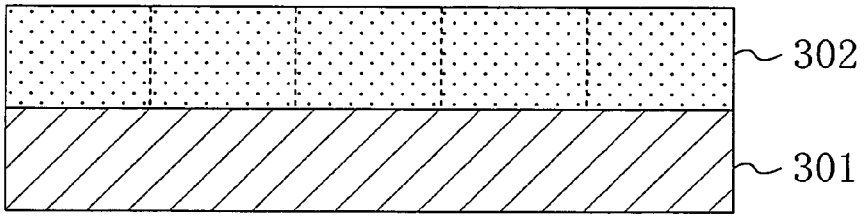
FIG. 6C
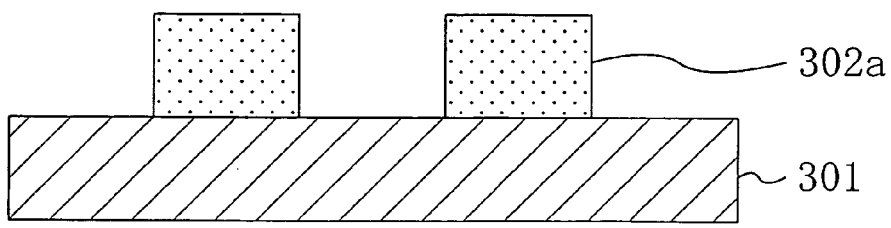
FIG. 6D

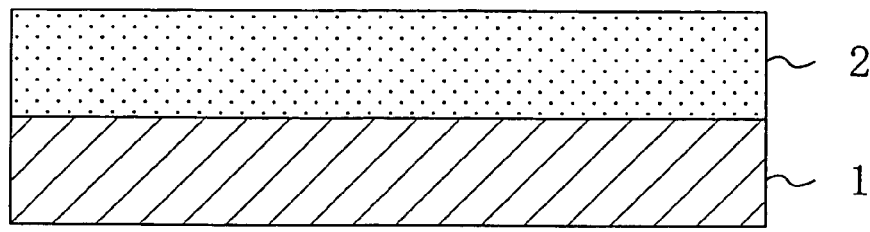
FIG. 7A
PRIOR ART
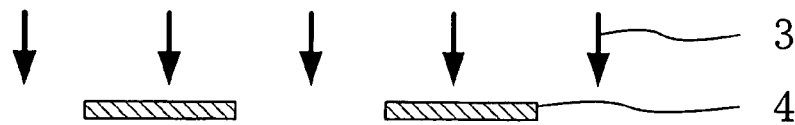
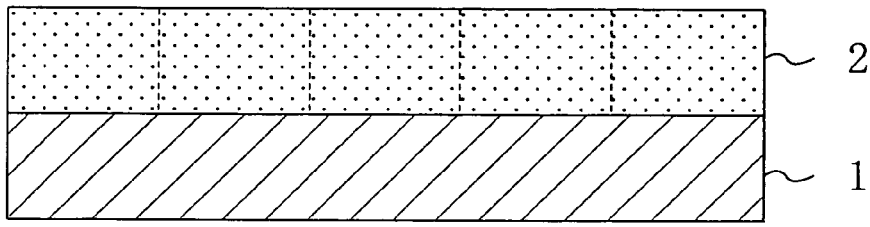
FIG. 7B
PRIOR ART
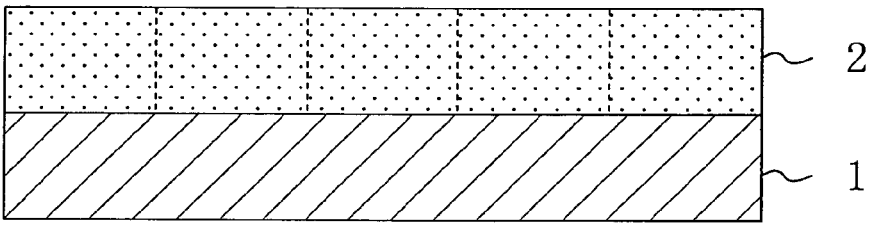
FIG. 7C
PRIOR ART
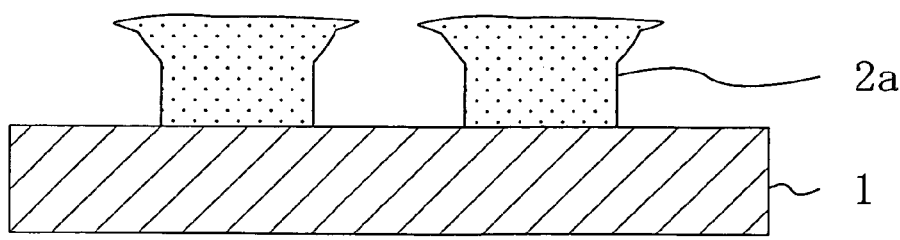
FIG. 7D
PRIOR ART

WATER-SOLUBLE MATERIAL, CHEMICALLY AMPLIFIED RESIST AND PATTERN FORMATION METHOD USING THE SAME

CROSS-REFERENCE TO RELATED APLICATIONS

This application claims priority under 35 U.S.C. §119 on Patent Application No. 2003-425071 filed in Japan on Dec. 22, 2003, the entire contents of which are hereby incorporated by reference.

BACKGROUND OF THE INVENTION

The present invention relates to a water-soluble material, a chemically amplified resist and a pattern formation method using the same for use in pattern formation in fabrication process or the like for semiconductor devices.

In accordance with the increased degree of integration of semiconductor integrated circuits and downsizing of semiconductor devices, there are increasing demands for higher performance of lithography technique. In particular, in order to refine patterns, a chemically amplified resist is currently used as a resist material. In the chemically amplified resist, an acid is generated from an acid generator included therein through exposure and post exposure bake, so as to cause a reaction of the resist by using the generated acid as a catalyst. Thus, the resolution and the sensitivity in the exposure are improved.

Now, a conventional pattern formation method will be described with reference to FIGS. 7A through 7D.

First, a positive chemically amplified resist material having the following composition is prepared:

| | |
|---|---|
| Base polymer: poly((t-butyloxycarbonylmethyloxystyrene) (65 mol %) - (hydroxystyrene) (35 mol %)) | 2 g |
| Acid generator: triphenylsulfonium nonaflate | 0.05 g |
| Solvent: propylene glycol monomethyl ether acetate | 18 g |

Next, as shown in FIG. 7A, the aforementioned chemically amplified resist material is applied on a substrate 1 so as to form a resist film 2 with a thickness of 0.4 μm.

Then, as shown in FIG. 7B, pattern exposure is carried out by irradiating the resist film 2 with exposing light 3 of KrF excimer laser with NA of 0.68 through a mask 4.

After the pattern exposure, as shown in FIG. 7C, the resist film 2 is baked with a hot plate at a temperature of 105° C. for 60 seconds (post exposure bake).

Next, the resultant resist film is developed with a 2.38 wt % tetramethylammonium hydroxide aqueous solution (alkaline developer). In this manner, a resist pattern 2a made of an unexposed portion of the resist film 2 and having a line width of 0.14 μm is formed as shown in FIG. 7D.

As shown in FIG. 7D, however, the resist pattern 2a formed by the conventional pattern formation method has a T-top shaped defective portion designated as an insoluble skin layer 2b on the uppermost portions of the side faces thereof (for example, see O. P. Kishkovich and C. E. Larson, "Amine Control for DUV Lithography: Identifying Hidden Sources", Proc. SPIE, 3999, 699 (2000)).

When the resist pattern 2a in such a defective shape is used for etching a target film, the resultant pattern of the target film is also in a defective shape, which disadvantageously lowers the productivity and the yield in the fabrication process for semiconductor devices.

Such an insoluble skin layer in the T-top shape is formed when a positive resist is used, and when a negative resist is used, pattern failure derived from reduction in the film thickness occurs.

SUMMARY OF THE INVENTION

In consideration of the aforementioned conventional problem, an object of the invention is forming a fine resist pattern in a good shape without forming an insoluble skin layer in development.

The present inventors have made various examinations to find the reason why an insoluble skin layer is formed in a chemically amplified resist during development, resulting in reaching the following conclusion: In general, an acid generator included in a chemically amplified resist does not have high solubility in a solvent, that is, the resist in this case, and hence, it is difficult to dissolve a sufficient amount of acid generator in the resist. Therefore, the amount of an acid generated through the exposure and the post exposure bake tends to be insufficient. Furthermore, when the acid generated in the exposure in an upper portion of the resist film is neutralized and deactivated by an impurity, such as ammonia, included in the atmosphere, the acid cannot be obtained in a sufficient amount for the development. Also, in the case where the amount of acid generator included in the resist material is originally insufficient, the resolution of the pattern is further lowered, resulting in forming an insoluble skin layer.

Accordingly, the present inventors have found the following: When a water-soluble film including a compound constructing an inclusion compound capable of incorporating an acid generator is formed on a resist film made of a chemically amplified resist or when the compound constructing an inclusion compound is included in a resist material itself, the reduced amount of the acid deactivated in the upper portion of the resist film is compensated, so as to prevent the formation of an insoluble skin layer.

The compound constructing an inclusion compound incorporates a hydrophobic compound to make it dissolve in an aqueous solution. The compound constructing an inclusion compound is a compound having a cavity mainly in the center thereof and having a cylindrical shape with a trapezoidal cross-section (bucket shape), and a hydrophilic group is coordinated in an outer portion thereof and a hydrophobic group is included in an inner portion thereof. In other words, the compound constructing an inclusion compound exhibits different properties between its outer portion and its inner portion. Therefore, when the compound constructing an inclusion compound is included in a water-soluble film formed on a resist film or in a resist film itself, an acid generator, which is generally difficult to dissolve in an aqueous solution, is incorporated into the inclusion compound and hence can be stably included in the water-soluble film or the resist film. Specifically, the acid generator and the hydrophobic group present in the inner portion of the inclusion compound are interacted with each other, and hence, the acid generator is incorporated into the inner portion of the inclusion compound. The hydrophilic group present in the outer portion of the inclusion compound is interacted with a water-soluble film component or a resist component, and thus, a large amount of acid generator can be dissolved in the water-soluble material or the resist. When the water-soluble film including the compound constructing the inclusion compound for incorporating the acid generator is formed on a chemically amplified resist film in this manner and the pattern exposure is performed through the resultant water-soluble film, a large amount of acid is generated from the water-soluble film formed on the resist film. This is because the acid generator incorporated in the inclusion compound generates the acid through irradiation with exposing light, and the generated acid is diffused within the resist film from the upper portion thereof. Alternatively, when the inclusion compound for incorporating the acid generator is included in the resist film itself and the pattern exposure is performed, a large amount of acid is generated in an exposed portion of the resist film. This is because not only an acid generator originally included in the resist film but also the acid generator incorporated in the inclusion compound generate the acid through irradiation with exposing light. As a result, even when the generated acid is deactivated to some extent due to the influence of an impurity included in the atmosphere, the acid necessary for resolution can be sufficiently kept in the resist film owing to the acid generated from the inclusion compound. Thus, the formation of an insoluble skin layer can be prevented, resulting in forming a fine pattern in a good shape. Since the inclusion compound is composed of entangled linear polymers and hence minimally has carbon multiple bonds such as an aromatic ring, even when the acid generator is incorporated therein, sufficient exposure for generating the acid can be attained.

The present invention was devised on the basis of the aforementioned findings, and according to the present invention, the formation of an insoluble skin layer formed in the upper portion of a resist pattern is prevented by adding a compound constructing an inclusion compound capable of incorporating an acid generator to a resist film or a water-soluble film formed on a resist film. Specifically, the invention is practiced as follows:

The water-soluble material of the invention is used for forming a water-soluble film on a chemically amplified resist film and includes a water-soluble polymer; an acid generator; a surface active agent; and an inclusion compound for incorporating the acid generator.

When pattern exposure is performed with the water-soluble film made of the water-soluble material of the invention formed on a chemically amplified resist film, a large amount of acid is generated from the inclusion compound incorporating the acid generator in the water-soluble film. The generated acid is uniformly dispersed from an upper portion of the chemically amplified resist film, and therefore, even when the acid generated in the upper portion of the resist film is deactivated due to the influence of an impurity included in the atmosphere, the amount of acid is sufficient for resolution, and hence, formation of an insoluble skin layer can be prevented. As a result, a fine resist pattern can be formed in a good shape.

The chemically amplified resist of this invention includes an acid generator; and an inclusion compound for incorporating the acid generator.

In the chemically amplified resist of this invention, a large amount of acid is generated in pattern exposure from the inclusion compound incorporating the acid generator. Therefore, even when the acid generated in an upper portion of the resist film is deactivated due to the influence of an impurity included in the atmosphere, the amount of acid is sufficient for resolution, and hence, formation of an insoluble skin layer can be prevented. As a result, a fine resist pattern can be formed in a good shape.

In the water-soluble material or the chemically amplified resist of the invention, the inclusion compound is preferably cyclic oligosaccharide.

In this case, the cyclic oligosaccharide is preferably cyclodextrin. As is generally known, cyclodextrin has a structure having a trapezoidal cylindrical shape (bucket shape) and constructs an inclusion compound by incorporating a guest compound into the inside of the cylindrical shape. As the cyclodextrin, α-cyclodextrin, β-cyclodextrin, γ-cyclodextrin or δ-cyclodextrin may be used. The content of the cyclodextrin is appropriately not smaller than 0.001 wt % and not larger than 1 wt %, which does not limit the invention.

In the water-soluble material of the invention, the water-soluble polymer may be polyvinyl alcohol, polyvinyl pyrrolidone, polystyrene sulfonic acid, polyacrylic acid or pullulan.

The water-soluble material of the invention preferably further includes a surface active agent. Thus, the effect of the inclusion compound is promoted owing to the polarization function of the surface active agent. This is because the inclusion compound is improved in its hydrophilic property.

In this case, the surface active agent may be a cationic surface active agent or a nonionic surface active agent. The content of the surface active agent is appropriately not smaller than $1 \times 10^{-4}$ wt % and not larger than $1 \times 10^{-2}$ wt %, which does not limit the invention.

The first pattern formation method of this invention includes the steps of forming a chemically amplified resist film on a substrate; forming, on the resist film, a water-soluble film including a water-soluble polymer, an acid generator and an inclusion compound for incorporating the acid generator; performing pattern exposure by selectively irradiating the resist film with exposing light through the water-soluble film; and developing the resist film after removing the water-soluble film after the pattern exposure.

According to the first pattern formation method of the invention, a large amount of acid is generated in the pattern exposure from the inclusion compound incorporating the acid generator in the water-soluble film. The generated acid is uniformly dispersed from an upper portion of the chemically amplified resist film, and therefore, even when the acid generated in the upper portion of the resist film is deactivated due to the influence of an impurity included in the atmosphere, the amount of acid is sufficient for resolution, and hence, formation of an insoluble skin layer can be prevented. As a result, a fine resist pattern can be formed in a good shape.

The second pattern formation method of this invention includes the steps of forming a chemically amplified resist film on a substrate; forming, on the resist film, a water-soluble film including a water-soluble polymer, an acid generator and an inclusion compound for incorporating the acid generator; performing pattern exposure by selectively irradiating the resist film with exposing light through the water-soluble film; and developing the resist film and removing the water-soluble film after the pattern exposure.

According to the second pattern formation method of the invention, a large amount of acid is generated in the pattern exposure from the inclusion compound incorporating the acid generator in the water-soluble film. The generated acid is uniformly dispersed from an upper portion of the chemically amplified resist film, and therefore, even when the acid generated in the upper portion of the resist film is deactivated due to the influence of an impurity included in the atmosphere, the amount of acid is sufficient for resolution, and hence, formation of an insoluble skin layer can be prevented. As a result, a fine resist pattern can be formed in a good shape.

In the first pattern formation method, the water-soluble film is removed from above the resist film before the development, and in the second pattern formation method, the water-soluble film is removed from above the resist film during the development. In the first pattern formation method, the development is ordinarily proceeded because the water-soluble film is removed before the development. In the second pattern formation method, the solution property of the resist can be controlled and hence is improved because the water-soluble film is removed during the development. The control of the solution property will be described later.

The third pattern formation method of this invention includes the steps of forming a chemically amplified resist film including an acid generator and an inclusion compound for incorporating the acid generator; performing pattern exposure by selectively irradiating the resist film with exposing light; and developing the resist film after the pattern exposure.

According to the third pattern formation method, in the development of the resist film performed after the pattern exposure, a large amount of acid is generated from the inclusion compound included in the resist film and incorporating the acid generator. Therefore, even when the acid generated in an upper portion of the resist film is deactivated due to the influence of an impurity included in the atmosphere, the amount of acid is sufficient for resolution, and hence, formation of an insoluble skin layer can be prevented. As a result, a fine resist pattern can be formed in a good shape.

In any of the first through third pattern formation methods, the inclusion compound is preferably cyclic oligosaccharide.

In this case, the cyclic oligosaccharide is preferably cyclodextrin.

In this case, the cyclodextrin may be α-cyclodextrin, β-cyclodextrin, γ-cyclodextrin or δ-cyclodextrin.

In the first or second pattern formation method, the water-soluble polymer may be polyvinyl alcohol, polyvinyl pyrrolidone, polystyrene sulfonic acid, polyacrylic acid or pullulan.

In the first or second pattern formation method, the water-soluble material preferably further includes a surface active agent.

In this case, the surface active agent may be a cationic surface active agent or a nonionic surface active agent.

In any of the first through third pattern formation methods, the exposing light may be KrF excimer laser, ArF excimer laser, $F_2$ laser, ArKr laser, $Ar_2$ laser, extreme UV of a wavelength band not shorter than 1 nm and not longer than 30 nm, or electron beams.

BRIEF DESCRIPTION OF THE DRAWINGS

FIG. 5 is a graph for explaining control of solubility of a resist in the pattern formation method using the water-soluble material of Embodiment 2;

FIGS. 6A, 6B, 6C and 6D are cross-sectional views for showing procedures in a pattern formation method using a chemically amplified resist according to Embodiment 3 of the invention; and FIGS. 7A, 7B, 7C and 7D are cross-sectional views for showing procedures in a conventional pattern formation method.

DETAILED DESCRIPTION OF THE INVENTION

Embodiment 1

A pattern formation method using a water-soluble material according to Embodiment 1 of the invention will now be described with reference to FIGS. 1A through 1D, 2A and 2B.

First, a positive chemically amplified resist material having the following composition is prepared:

| | |
|---|---|
| Base polymer: poly((t-butyloxycarbonylmethyloxystyrene) (65 mol %) - (hydroxystyrene) (35 mol %)) | 2 g |
| Acid generator: triphenylsulfonium triflate | 0.05 g |
| Solvent: propylene glycol monomethyl ether acetate | 18 g |

Figure 1A:
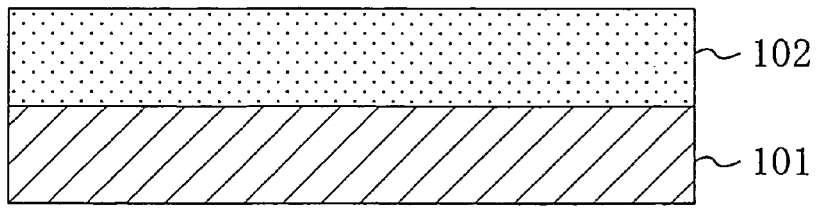
FIGS. 1A, 1B, 1C and 1D are cross-sectional views for showing procedures in a pattern formation method using a water-soluble material according to Embodiment 1 of the invention.

Next, as shown in FIG. 1A, the aforementioned chemically amplified resist material is applied on a substrate 101 so as to form a resist film 102 with a thickness of 0.4 μm.

Figure 1B:
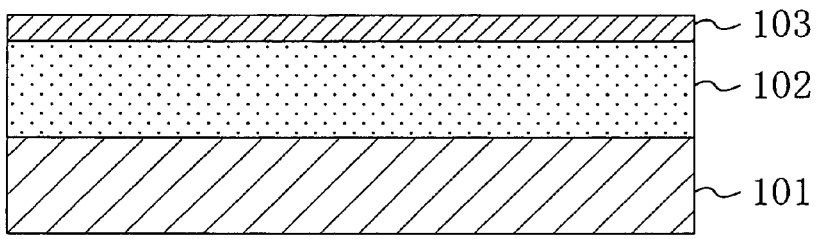

Then, as shown in FIG. 1B, a water-soluble film 103 with a thickness of 0.08 μm made of a water-soluble material having the following composition is formed on the resist film 102 by, for example, spin coating:

| | |
|---|---|
| Base polymer: polyvinyl alcohol | 1 g |
| Acid generator: diphenyliodonium triflate | 0.04 g |
| Compound constructing inclusion compound: α-cyclodextrin | 0.07 g |
| Solvent: water | 7.5 g |

Figure 1C:
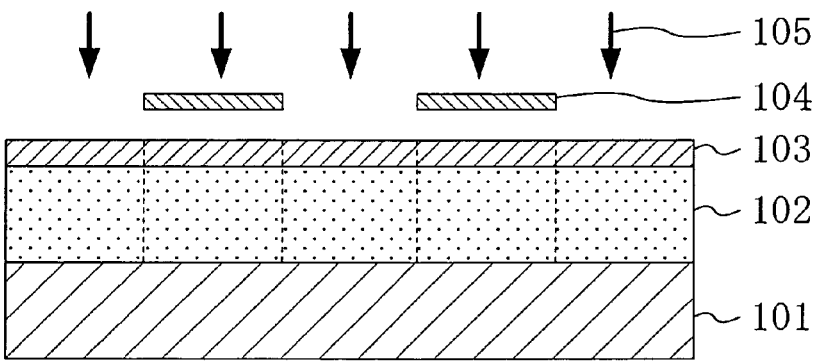

Next, as shown in FIG. 1C, pattern exposure is carried out by irradiating the resist film 102 through the water-soluble film 103 with exposing light 105 of KrF excimer laser with NA of 0.68 having passed through a mask 104.

Figure 1D:
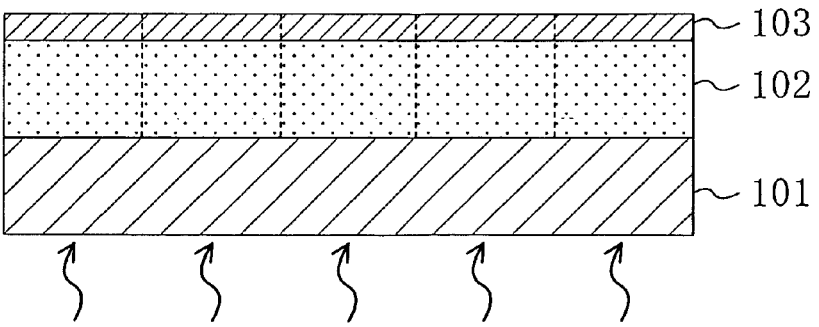

After the pattern exposure, as shown in FIG 1D, the resist film 102 is baked with a hot plate at a temperature of 105° C. for 60 seconds (post exposure bake).

Figure 2A:
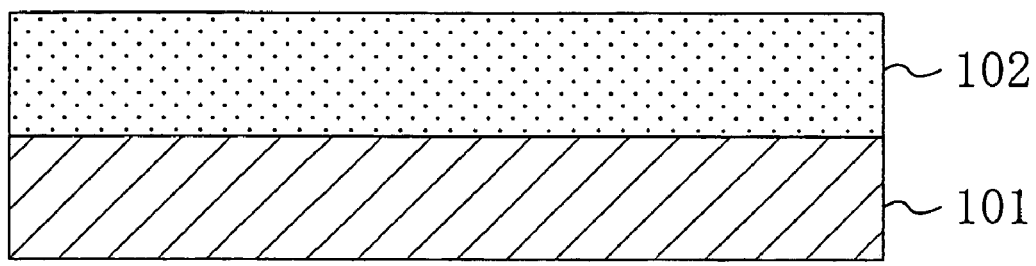
FIGS. 2A and 2B are cross-sectional views for showing other procedures in the pattern formation method using the water-soluble material of Embodiment 1.
Figure 2B:
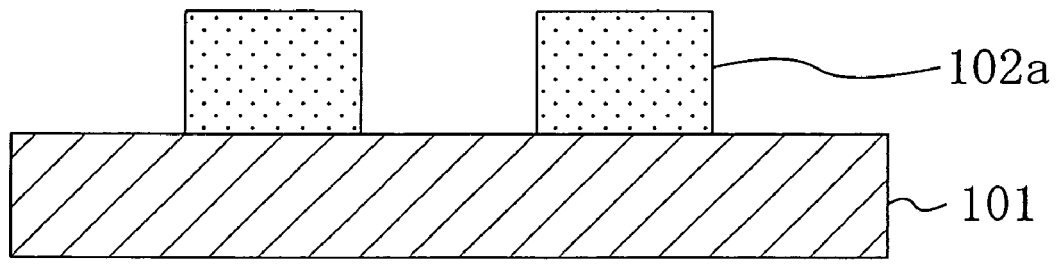

Then, as shown in FIG. 2A, after removing the water-soluble film 103 with water, the resultant resist film 102 is developed with a 2.38 wt % tetramethylammonium hydroxide aqueous solution (alkaline developer). In this manner, a resist pattern 102a made of an unexposed portion of the resist film 102 and having a line width of 0.14 μm is formed as shown in FIG. 2B.

In this manner, in the pattern formation method of Embodiment 1, the pattern exposure is performed with the water-soluble film 103 including the acid generator and α-cyclodextrin, that is, the compound constructing an inclusion compound for incorporating the acid generator, formed on the resist film 102. Therefore, in the pattern exposure, a large amount of acid is generated from the acid generator incorporated in the inclusion compound of the water-soluble film 103 through irradiation with the exposing light. The acid thus generated in a large amount is diffused in an upper portion of the resist film 102 through the following post exposure bake. Therefore, even when the acid generated in the upper portion of the resist film 102 is deactivated due to the influence of an impurity or the like included in the atmosphere, a shortage of the acid necessary for resolution can be avoided, resulting in forming the resist pattern 102a in a good shape.

The cyclodextrin included in the water-soluble film 103 is not limited to α-cyclodextrin but may be β-cyclodextrin, γ-cyclodextrin, δ-cyclodextrin or the like instead.

The base polymer of the water-soluble film 103 is not limited to polyvinyl alcohol but may be polyvinyl pyrrolidone, polystyrene sulfonic acid, polyacrylic acid or pullulan instead.

Embodiment 2

A pattern formation method using a water-soluble material according to Embodiment 2 of the invention will now be described with reference to FIGS. 3A through 3D and 4.

First, a positive chemically amplified resist material having the following composition is prepared:

| | |
|---|---:|
| Base polymer: poly((t-butyloxycarbonylmethyloxystyrene) (65 mol %) - (hydroxystyrene) (35 mol %)) | 2 g |
| Acid generator: triphenylsulfonium triflate | 0.05 g |
| Solvent: propylene glycol monomethyl ether acetate | 18 g |

Figure 3A:
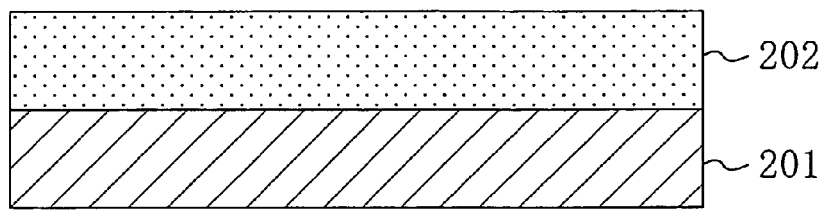
FIGS. 3A, 3B, 3C and 3D are cross-sectional views for showing procedures in a pattern formation method using a water-soluble material according to Embodiment 2 of the invention.

Next, as shown in FIG. 3A, the aforementioned chemically amplified resist material is applied on a substrate 201 so as to form a resist film 202 with a thickness of 0.4 μm.

Figure 3B:
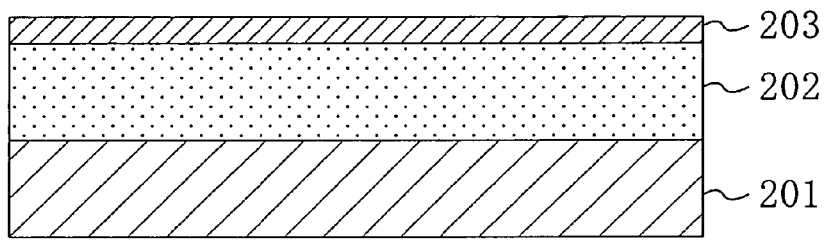

Then, as shown in FIG. 3B, a water-soluble film 203 with a thickness of 0.07 μm made of a water-soluble material having the following composition is formed on the resist film 202 by, for example, the spin coating:

| | |
|---|---:|
| Base polymer: polyvinyl pyrrolidone | 1 g |
| Acid generator: triphenylsulfonium nonaflate | 0.05 g |
| Compound constructing inclusion compound: β-cyclodextrin | 0.08 g |
| Surface active agent: cetylmethylammonium chloride | 0.0002 g |
| Solvent: water | 7.5 g |

Figure 3C:
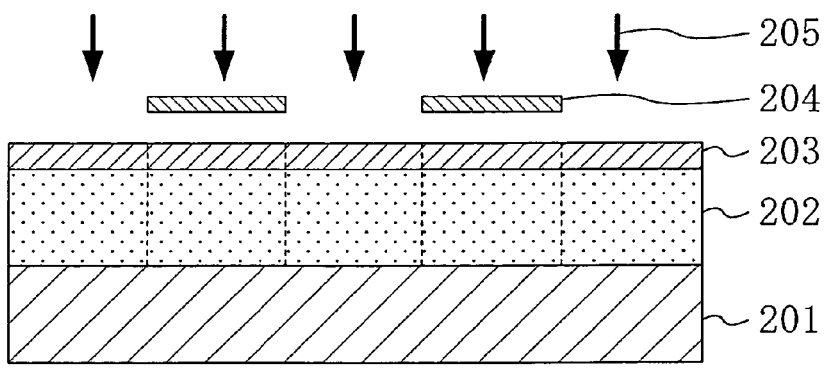

Next, as shown in FIG. 3C, pattern exposure is carried out by irradiating the resist film 202 through the water-soluble film 203 with exposing light 205 of KrF excimer laser with NA of 0.68 having passed through a mask 204.

Figure 3D:
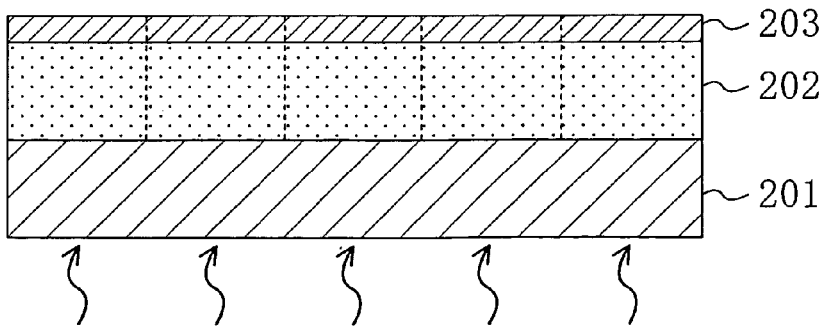

After the pattern exposure, as shown in FIG. 3D, the resist film 202 is baked with a hot plate at a temperature of 105° C. for 60 seconds (post exposure bake).

Figure 4:
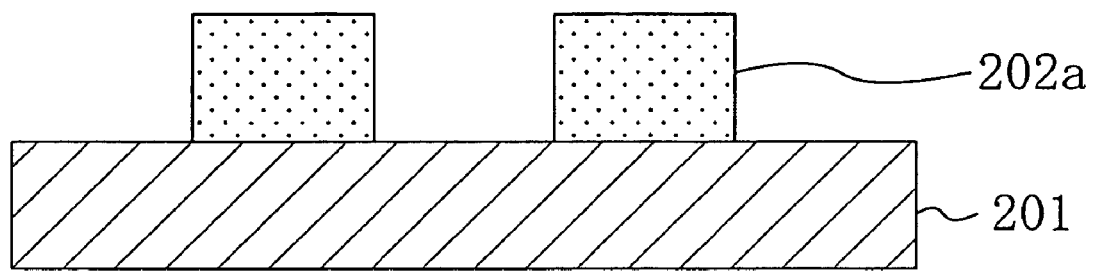
FIG. 4 is a cross-sectional view of another procedure in the pattern formation method using the water-soluble material of Embodiment 2.

Then, as shown in FIG. 4, the water-soluble film 203 is removed and the resultant resist film 202 is developed with a 2.38 wt % tetramethylammonium hydroxide aqueous solution (alkaline developer). In this manner, a resist pattern 202a made of an unexposed portion of the resist film 202 and having a line width of 0.14 μm is formed as shown in FIG. 4.

In this manner, in the pattern formation method of Embodiment 2, the pattern exposure is performed with the water-soluble film 203 including the acid generator, β-cyclodextrin, that is, the compound constructing an inclusion compound for incorporating the acid generator, and the surface active agent formed on the resist film 202. Therefore, in the pattern exposure, a large amount of acid is generated from the acid generator incorporated in the inclusion compound of the water-soluble film 203 through irradiation with the exposing light 205. The acid thus generated in a large amount is diffused in an upper portion of the resist film 202 through the following post exposure bake. Therefore, even when the acid generated in the upper portion of the resist film 202 is deactivated due to the influence of an impurity or the like included in the atmosphere, a shortage of the acid necessary for resolution can be avoided, resulting in forming the resist pattern 202a in a good shape.

The cyclodextrin included in the water-soluble film 203 is not limited to β-cyclodextrin but may be α-cyclodextrin, γ-cyclodextrin, δ-cyclodextrin or the like instead.

The base polymer of the water-soluble film 203 is not limited to polyvinyl pyrrolidone but may be polyvinyl alcohol, polystyrene sulfonic acid, polyacrylic acid or pullulan instead.

The surface active agent included in the water-soluble film 203 is not limited to cetylmethylammonium chloride, that is, a cationic surface active agent, but may be a nonionic surface active agent. Examples of the cationic surface active agent are, apart from cetylmethylammonium chloride, stearylmethylammonium chloride, stearyltrimethylammonium chloride, distearyldimethylammonium chloride, stearyldimethylbenzylammonium chloride, dodecylmethylammonium chloride, dodecyltrimethylammonium chloride, benzylmethylammonium chloride, benzyltrimethylammonium chloride, and benzalkonium chloride.

Also, examples of the nonionic surface active agent are nonyl phenol ethoxylate, octylphenyl polyoxyethylene ether, lauryl polyoxyethylene ether, cetyl polyoxyethylene ether, sucrose fatty ester, polyoxyethylene lanolin fatty ester, polyoxyethylene sorbitan fatty ester, polyoxyethylene glycol mono fatty ester, fatty monoethanolamide, fatty diethanolamide and fatty triethanolamide.

Furthermore, it is not always necessary to include the surface active agent in the water-soluble film 203. On the contrary, any of the aforementioned cationic surface active agents and nonionic surface active agents may be included in the water-soluble film 103 of Embodiment 1.

In the pattern formation method of Embodiment 2, differently from that of Embodiment 1, the water-soluble film 203 is removed during the development, namely, with the developer. Thus, the solution property of the resist film 202 can be controlled. Now, the control of the solution property will be described with reference to FIG. 5.

In general, when the solution property of a resist in a developer is high, the dissolving rate is abruptly increased when exposure exceeds a given threshold value as shown with a graph A of a broken line in FIG. 5. As the change of the dissolving rate against the exposure is more abrupt, a difference in the solubility between an exposed portion and an unexposed portion of the resist film 202 is larger, and hence, higher resolution can be attained, namely, the resist pattern 202a can be formed in a better shape. Accordingly, in the case where the water-soluble film 203 is removed simultaneously with the development, the dissolving rate is wholly lowered during the removal of the water-soluble film 203 as shown with a graph B of a solid line in FIG. 5, and hence, the change in a portion surrounded with a circle C in the graph B can be reduced to be approximated to a flat portion of the graph A. As a result, in the case where the actual resist has the solution property as shown with the graph B, the dissolving rate attained with smaller exposure can be adjusted to attain a comparatively constant solution state with small exposure and a low dissolving rate within a given range. Accordingly, the difference in the solubility between an exposed portion and an unexposed portion of the resist film 202 can be substantially increased, resulting in easily forming a resist pattern in a good shape.

Embodiment 3

A pattern formation method using a chemically amplified resist according to Embodiment 3 of the invention will now be described with reference to FIGS. 6A through 6D.

First, a positive chemically amplified resist material having the following composition is prepared:

| | |
|---|---|
| Base polymer: poly((t-butyloxycarbonylmethyloxystyrene) (65 mol %) - (hydroxystyrene) (35 mol %)) | 2 g |
| Compound constructing inclusion compound: α-cyclodextrin | 0.25 g |
| Acid generator: triphenylsulfonium triflate | 0.2 g |
| Solvent: propylene glycol monomethyl ether acetate | 18 g |

Next, as shown in FIG. 6A, the aforementioned chemically amplified resist material is applied on a substrate 301 so as to form a resist film 302 with a thickness of 0.4 μm.

Then, as shown in FIG. 6B, pattern exposure is carried out by irradiating the resist film 302 with exposing light 305 of KrF excimer laser with NA of 0.68 through a mask 304.

After the pattern exposure, as shown in FIG. 6C, the resist film 302 is baked with a hot plate at a temperature of 105° C. for 60 seconds (post exposure bake).

Then, as shown in FIG. 6D, the resultant resist film 202 is developed with a 2.38 wt % tetramethylammonium hydroxide aqueous solution (alkaline developer). In this manner, a resist pattern 302 a made of an unexposed portion of the resist film 302 and having a line width of 0.14 μm is formed as shown in FIG. 6D.

In this manner, in the pattern formation method of Embodiment 3, the chemically amplified resist material including the acid generator includes α-cyclodextrin, that is, the compound constructing an inclusion compound for incorporating the acid generator. Therefore, in the pattern exposure, a large amount of acid is generated from the acid generator incorporated in the inclusion compound through irradiation with the exposing light 305. The acid thus generated in a large amount is diffused in the resist film 302 through the following post exposure bake. Therefore, even when the acid generated in an upper portion of the resist film 302 is deactivated due to the influence of an impurity or the like included in the atmosphere, a shortage of the acid necessary for resolution can be avoided, resulting in forming the resist pattern 302a in a good shape.

The cyclodextrin included in the chemically amplified resist is not limited to α-cyclodextrin but may be β-cyclodextrin, γ-cyclodextrin, δ-cyclodextrin or the like instead.

In each of Embodiments 1 through 3, the exposing light used for the pattern exposure is not limited to the KrF excimer laser but may be ArF excimer laser, $F_2$ laser, ArKr laser, $Ar_2$ laser, extreme UV of a wavelength band not shorter than 1 nm and not longer than 30 nm or electron beams.

Although the positive chemically amplified resist is used in each of Embodiments 1 through 3, the present invention is applicable to a negative chemically amplified resist.

As described so far, according to the water-soluble material, the chemically amplified resist and the pattern formation method of the invention, occurrence of pattern failure caused by an insoluble skin layer in a resist pattern after development can be prevented, and therefore, the resist pattern can be formed in a good shape. Thus, the invention is useful as a water-soluble material, a chemically amplified resist and a pattern formation method using the same for use in pattern formation of fabrication process or the like of semiconductor devices.

What is claimed is:

1. A pattern formation method comprising the steps of:
   forming a chemically amplified resist film on a substrate;
   forming, on said resist film, a water-soluble film including a water-soluble polymer, an acid generator and an inclusion compound for incorporating said acid generator;
   performing pattern exposure by selectively irradiating said resist film with exposing light through said water-soluble film; and
   developing said resist film after removing said water-soluble film after the pattern exposure.

2. The pattern formation method of claim 1, wherein said inclusion compound is cyclic oligosaccharide.

3. The pattern formation method of claim 2, wherein said cyclic oligosaccharide is cyclodextrin.

4. The pattern formation method of claim 3, wherein said cyclodextrin is α-cyclodextrin, β-cyclodextrin, γ-cyclodextrin or δ-cyclodextrin.

5. The pattern formation method claim 1, wherein said water-soluble polymer is polyvinyl alcohol, polyvinyl pyrrolidone, polystyrene sulfonic acid, polyacrylic acid or pullulan.

6. The pattern formation method of claim 1, wherein said water-soluble material further includes a surface active agent.

7. The pattern formation method of claim 6, wherein said surface active agent is a cationic surface active agent or a nonionic surface active agent.

8. The pattern formation method of claim 7, wherein said cationic surface active agent is cetylmethylammonium chloride, stearylmethylammonium chloride, cetyltrimethylammonium chloride, stearyltrimethylammonium chloride, distearyldimethylammonium chloride, stearyldimethylbenzylammonium chloride, dodecylmethylammonium chloride, dodecyltrimethylammonium chloride, benzylmethylammonium chloride, benzyltrimethylammonium chloride or benzalkonium chloride.

9. The pattern formation method of claim 7, wherein said nonionic surface active agent is nonyl phenol ethoxylate, octylphenyl polyoxyethylene ether, lauryl polyoxyethylene ether, cetyl polyoxyethylene ether, sucrose fatty ester, polyoxyethylene lanolin fatty ester, polyoxyethylene sorbitan fatty ester, polyoxyethylene glycol mono fatty ester, fatty monoethanolamide, fatty dietanolamide or fatty triethanolamide.

10. The pattern formation method of claim 1, wherein said exposing light is KrF excimer laser, ArF excimer laser, $F_2$ laser, ArKr laser, $Ar_2$ laser, extreme UV of a wavelength band not shorter than 1 nm and not longer than 30 nm, or electron beams.

11. A pattern formation method comprising the steps of:
forming a chemically amplified resist film on a substrate;
forming, on said resist film, a water-soluble film including
   a water-soluble polymer, an acid generator and an
   inclusion compound for incorporating said acid generator;
performing pattern exposure by selectively irradiating
   said resist film with exposing light through said water-soluble film; and
developing said resist film and removing said water-soluble film after the pattern exposure.

12. The pattern formation method of claim 11, wherein said exposing light is KrF excimer laser, ArF excimer laser, $F_2$ laser, ArKr laser, $Ar_2$ laser, extreme UV of a wavelength band not shorter than 1 nm and not longer than 30 nm, or electron beams.

* * * * *

UNITED STATES PATENT AND TRADEMARK OFFICE
CERTIFICATE OF CORRECTION

PATENT NO. : 7,198,888 B2
APPLICATION NO. : 11/013333
DATED : April 3, 2007
INVENTOR(S) : Masayuki Endo et al.

It is certified that error appears in the above-identified patent and that said Letters Patent is hereby corrected as shown below:

On the title pages:

Under section "(56) References Cited, FOREIGN PATENT DOCUMENTS", delete "JP 2001-138156A 5/2000", Under section "(56) Reference Cited, OTHER PUBLICATIONS", delete "Namatsu, Hideo, et al. "Supercritical resist dryer." J. Vac. Sci. technol. B 18(2) Mar/Apr. 2000, pp. 780-784. ", delete " Tanaka, Keiichi., et al. "Improvement of pattern collapse issue by additive added D.I water rinse process." Proc. SPIE. Vol. 5039, p. 1366-1381(2003).,"

change "Kishkovich, Oleg P., et al, "Amino Control for DUV Lithography: Identifying Hidden Sources." Proc of SPIE vol. 3999, 6999 (2000) pp. 699-705." to -- Kishkovich, Oleg P., et al, "Amine Control for DUV Lithography: Identifying Hidden Sources." Proc of SPIE vol. 3999, 6999 (2000) pp. 699-705. --

Signed and Sealed this

Seventeenth Day of July, 2007

JON W. DUDAS
*Director of the United States Patent and Trademark Office*